United States Patent
Goerlach

(10) Patent No.: US 9,508,643 B2
(45) Date of Patent: Nov. 29, 2016

(54) ELECTRONIC COMPONENT

(71) Applicant: Robert Bosch GmbH, Stuttgart (DE)

(72) Inventor: Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/843,542

(22) Filed: Sep. 2, 2015

(65) Prior Publication Data

US 2016/0071794 A1  Mar. 10, 2016

(30) Foreign Application Priority Data

Sep. 8, 2014  (DE) .................. 10 2014 217 938

(51) Int. Cl.
| | | |
|---|---|---|
| H01L 23/52 | (2006.01) | |
| H01L 23/528 | (2006.01) | |
| H01L 23/532 | (2006.01) | |
| H01L 29/06 | (2006.01) | |
| H01L 23/00 | (2006.01) | |

(52) U.S. Cl.
CPC ......... *H01L 23/528* (2013.01); *H01L 23/5329* (2013.01); *H01L 23/53233* (2013.01); *H01L 24/01* (2013.01); *H01L 24/33* (2013.01); *H01L 29/0657* (2013.01)

(58) Field of Classification Search
CPC ............. H01L 23/528; H01L 29/0657; H01L 23/53233; H01L 23/5329; H01L 24/01
USPC ........................................................ 257/786
See application file for complete search history.

(56) References Cited

U.S. PATENT DOCUMENTS

| | | | | |
|---|---|---|---|---|
| 4,408,216 A | * | 10/1983 | Gould | H01L 21/28537 257/486 |
| 6,836,006 B2 | * | 12/2004 | Muto | H01L 24/73 257/686 |
| 7,504,720 B2 | * | 3/2009 | Nakatsu | H01L 25/071 257/712 |
| 9,241,429 B2 | * | 1/2016 | Kaneko | H02M 7/003 |
| 2014/0321063 A1 | * | 10/2014 | Uhlemann | B23K 9/042 361/719 |

FOREIGN PATENT DOCUMENTS

DE   10 2010 063 021   6/2012

* cited by examiner

*Primary Examiner* — Luan C Thai
(74) *Attorney, Agent, or Firm* — Norton Rose Fulbright US LLP; Gerard Messina

(57) ABSTRACT

An electronic component includes: a plate-shaped semiconductor element connected to a metallic contacting by a sinter layer; a dielectric layer having a surface metal layer disposed thereon, the dielectric layer being provided in an edge region of the semiconductor element, the edge region being provided with raised areas and depressions by patterning of the dielectric layer and/or the surface metal layer; and the sinter layer covers the edge region with the raised areas and depressions and thereby connects the edge region to the metallic contacting.

9 Claims, 5 Drawing Sheets

ELECTRONIC COMPONENT

BACKGROUND OF THE INVENTION

1. Field of the Invention

The present invention relates to an electronic component in which a plate-shaped semiconductor element is connected to a metallic plate by a sinter layer.

2. Description of the Related Art

Electronic components in which a plate-shaped semiconductor element is connected to a metallic plate by a sinter layer are already known from the German patent application publication DE 10 2010 063 021 A1. Prior patterning of the sinter layer is employed there in order to reduce mechanical stresses between the plate-shaped semiconductor element and the metallic plates. In addition to the prior patterning of the sinter layer, this also requires a precise adjustment of the sinter layer relative to the metallic plates and the plate-shaped semiconductor element during the assembly.

BRIEF SUMMARY OF THE INVENTION

In contrast, the electronic component according to the present invention has the advantage that no patterning of the sinter layer is necessary to reduce the mechanical stresses between the plate-shaped semiconductor element and the metallic plate connected thereto by the sinter layer. Patterning of a dielectric layer provided on the semiconductor element anyway, and/or of a surface metal layer that is required as it is, are/is provided for this purpose in the present invention. This patterning preferably is implemented in the edge region of the semiconductor element, since the mechanical stresses in that area are especially problematic.

Because of a jagged development of the patterning, the contact surface between the sinter layer and the semiconductor element is effectively enlarged and the mechanical stresses are reduced considerably as a result. The jags may be developed in rectangular or triangular form or in the way of postage stamp edges. As a further alternative, the patterning may be in the shape of insular regions. Silicon oxide, silicon nitride or a temperature-stable plastic such as polyimide is preferably used as the dielectric layer. The surface metal layers cover not only the edge region but also establish an electrical contact between the semiconductor element and the sinter layer. The sinter layer is preferably created from metallic particles, in particular silver particles. The metallic plate connected to the semiconductor element thereby forms a contact of the semiconductor element. Copper, in particular copper covered by a thin noble metal layer, is the preferred metal for the metallic plate. The electronic component preferably is used as a rectifier structure in a generator.

DETAILED DESCRIPTION OF THE INVENTION

Figure 1:
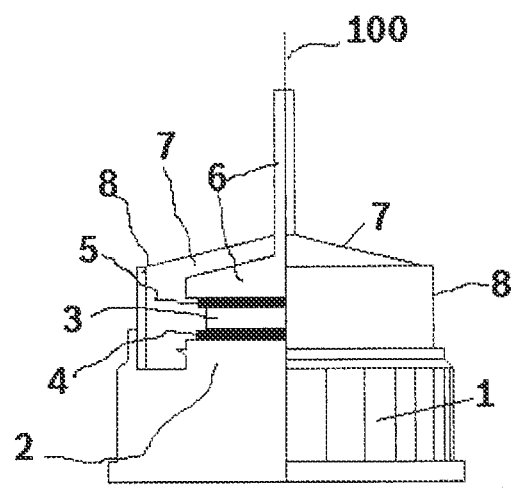
FIG. 1 shows an overview-type side view and an overview-type sectional view of an electronic component according to the present invention.

FIG. 1 shows a cross-section on the left side of axis 100, and an external view of a diode for a generator, in particular for a generator in a motor vehicle, on the right side of axis 100. This diode has a press-fit base 1, which is provided with what is known as knurling, i.e., grooves, on its outer side. Press-fit base 1 is pressed into a corresponding opening of a metallic rectifier system by way of this knurling. The grooves of the knurling create an especially tight form-fitting connection of press-fit base 1 and the rectifier system, so that excellent electrical contacting and very satisfactory heat dissipation are ensured. As can be gathered from the cross-section, press-fit base 1 also has metallic contacting 2, on top of which actual semiconductor element 3 is mounted. Semiconductor element 3 is connected to metallic contacting 2 by an electrically conductive sinter layer 4. Semiconductor element 3 is similarly connected to metallic contacting 6 via an electrically conductive sinter layer 5. In addition, semiconductor element 3 may also have thin surface contacting layers 11, which are disposed between semiconductor element 3 and sinter layer 5 as well as sinter layer 4. For example, a layer sequence of Cr, NiV7, and Ag may be used for connecting semiconductor element 3 to first sinter layer 5 and second sinter layer 4. Furthermore, the totality of metallic contacting 6, semiconductor element 3, and metallic contacting 2 is completely enveloped by a casting compound 7. Casting compound 7 is an insulating plastic mass with the task of absorbing a portion of the mechanical forces that are acting on contacting 6, sinter layer 5, semiconductor element 3, sinter layer 4 and metallic contacting 2. In addition, a plastic ring 8 is provided as an aid in the casting process, which acts as a casting sleeve for plastic mass 7 during the assembly. An epoxy filled with quartz pellets, or some other plastic material having high-temperature stability, for example, may be used as plastic mass 7. A material providing excellent electrical conductivity and good thermal conductivity, e.g., copper, is preferably used as the material for first contacting 6 or second contacting 2 or press-fit base 1. To ensure a proper connection of the sinter layer, these copper materials are provided with a thin surface layer of noble metal, such as a silver layer. A diode element of this type as shown in FIG. 1 is already known from published German patent application document DE 10 2007 063 308, for example.

For sinter layers 4, 5, a pasty material of a plastic material including metal particles is first applied on semiconductor element 3 and/or metallic contactings 2, 6. Printing or the insertion of corresponding foils may be employed for this purpose. With the aid of a heat treatment, the plastic is then transferred into a gaseous state and the metal particles are joined to one another and to the surfaces of semiconductor element 3 and metallic contactings 2, 6 with the aid of a sinter process. This produces an electrical and mechanical connection between semiconductor element 3 and metallic contactings 2, 6. A misalignment may occur in the course of this production method, that is to say, the placement of the sinter material may fail to correspond to the desired position.

The connection layer in particular not only may come to rest on an intended center region of the semiconductor element 3 by such a faulty alignment, but in an undesired edge region, as well.

Figure 2:
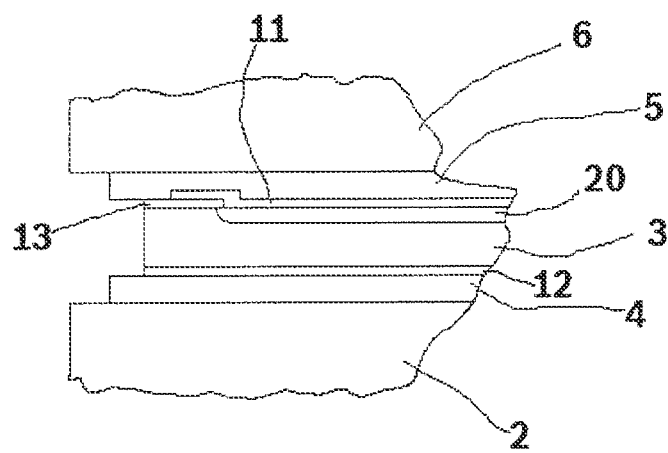
FIG. 2 shows a detailed sectional view of a component according to the present invention.

FIG. 2 shows a detailed view of an electronic component according to the present invention, where especially an edge region of semiconductor element 3 is shown in greater detail. Semiconductor element 3 has a surface metal layer 12 on its underside, by way of which an electrical contact of the semiconductor material is established. This surface metal layer 12 is connected to lower metal contacting 2 by a sinter layer 4. Semiconductor element 3 is thus firmly secured on the lower metallic contacting 2, which specifically may be developed as a base in this case, as shown in FIG. 1. On the top side, semiconductor element 3 is provided with a dielectric layer 13 in the edge region. In addition, a surface metallization 11 is applied on the top side, which contacts a center region of semiconductor element 3. A sinter layer 5, by which a mechanical and electrical contact to upper metallic contacting 6 is established, is situated on dielectric layer 13 and surface metallization 11.

Semiconductor element 3 is produced in the conventional manner by processing a very large semiconductor plate, especially a silicon wafer, whereupon individual semiconductor elements 3 are cut up into individual components by sawing. This sawing process creates crystal interference in the edge region, which leads to changes in the electrical properties of the semiconductor element. The edge region can therefore not be used for the actual function of the semiconductor element, because the sawing process causes crystal damage to the semiconductor material that results in poorer characteristics. The use of dielectric layer 13 provided in the edge region of semiconductor element 3 prevents electrical contacting between sinter layer 5 and the semiconductor material. This ensures that only the region of semiconductor element 3 that is not damaged by the sawing processing step will be used for the function of the semiconductor element.

FIG. 2 exemplarily illustrates an active region 20, which is developed only in the center region of semiconductor element 3. For instance, this active region may be p-doping in a semiconductor element 3 that features n-doping. This creates a diode, for example. As an alternative to this pn diode, however, it is also possible to provide clearly different functional elements that are electrically contacted by surface metal layer 11.

Surface metal layer 11 is produced in the usual manner by a process that produces characteristics of the contacting between metal layer 11 and the material of semiconductor element 3 that are easily reproducible in terms of quality. For example, such processes are sputtering or a vapor deposition of metal layers. For instance, common metal layers 11 use a sequence of chromium, nickel and a noble metal. Such a layer sequence creates an excellent and reproducible contact to semiconductor element 3 and forms an optimal surface for contacting by a sinter material 5. Since dielectric layer 13 is situated in the edge region, there is no risk that sinter layer 5 creates an electric contact to the semiconductor material in this edge region. It is thereby ensured that any contacting of metallic contacting 6 via sinter layer 5 takes place only in the area where surface metal layer 11 is provided.

Both dielectric layer 13 and surface metal layer 11 must be patterned in order to have the proper development for their function on the top surface of semiconductor element 3. In the present invention it is now proposed to utilize this patterning of dielectric layer 13 and metal layer 11, which is required as it is, for the purpose of reducing the mechanical stresses between metallic contacting 6 of sinter layer 5 and semiconductor element 3. This procedure will now be illustrated with the aid of FIGS. 3, 4, and 5.

Figure 3:
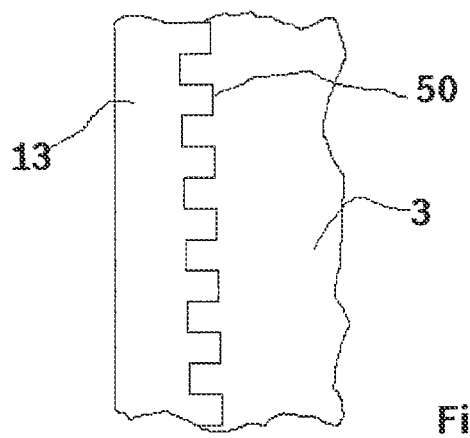
FIG. 3 shows a first plan view of a semiconductor element.

FIG. 3 shows a plan view of semiconductor element 3 from FIG. 2 in the edge region. To illustrate the manner in which dielectric layer 13 is developed, metallic contacting 6, sinter layer 5, and metal layer 11 have been omitted in the view of FIG. 3 or removed from corresponding semiconductor element 3. The plan view of FIG. 3 clearly demonstrates that dielectric layer 13 is patterned in the form of jags on the side pointing to the inside. Jagged patterning 50 is developed in rectangular form in the plan view of FIG. 3. As an alternative, however, this jagged patterning 50 may also be developed in triangular shape or resemble the edge of a postage stamp with a series of semicircular indentations. Essential is simply that dielectric layer 13 still fully covers the edge region, so that no contacting of the damaged edge region of semiconductor element 3 by sinter layer 5 is able to occur, but that patterning is provided starting from the edge region and extending further toward the inside. The rectangular, jagged patterning 50 is shown in FIG. 3 by way of example.

Figure 4:
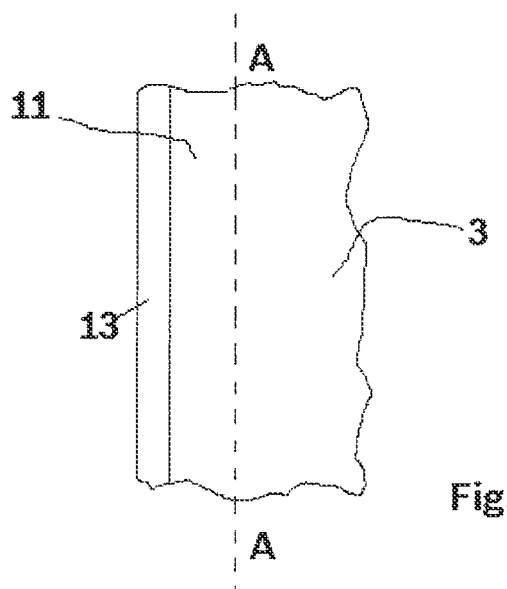
FIG. 4 shows a further plan view of the semiconductor element.

FIG. 4 illustrates the same plan view of the element according to FIG. 3, but includes surface metal layer 11. It is clear from the plan view of FIG. 4 that the surface metallization completely covers the area of jagged patterning 50, so that jagged patterning 50 of FIG. 3 is no longer visible in the plan view of FIG. 4. Starting from the edge of semiconductor element 3, no more than a narrow strip of dielectric layer 13 is visible in the plan view of FIG. 4; adjacent to it is a surface metallization 11, which extends across the area of semiconductor element 3 that lies further toward the inside.

Figure 5:
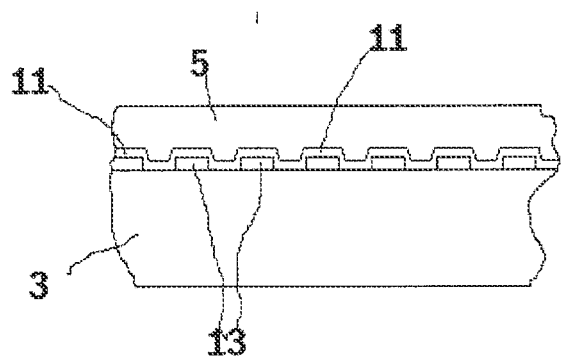
FIG. 5 shows a section through FIG. 4.

FIG. 5 shows a section through FIG. 4 along line A-A. Line A-A is placed in such a way that it lies in the area of jagged patterning 50 of dielectric layer 13. From the cross-section of FIG. 5 it is clear that on the topside of semiconductor element 3, the dielectric layer has individual regions that are created by the various jags of jagged patterning 50. Surface metallization 11 has appropriately adapted itself to these jags in the jagged region, so that the surface metallization in the region of a jag forms a raised area and lies directly on semiconductor element 3 between two jags, forming a depression. Along this line A-A, the surface of metallization 11 thus forms a sequence of raised areas and depressions, so that the surface area between surface metallization 11 and sinter layer 5 becomes considerably larger. During the sintering process, sinter layer 5 is pressed onto the surface of component 3 or metallization 11 and thereby nestles against the raised areas and depressions. This creates an enlarged surface between surface metallization 11 and sinter layer 5. The mechanical stresses that arise between the individual layers are therefore distributed to a larger surface and thus are reduced accordingly per surface area. This enlargement of the surface in the edge region of semiconductor element 3 consequently reduces the mechanical stresses, and the risk of overloading either sinter layer 5 or the material of component 3 is lower. Since patterning of dielectric layer 13 must take place as it is, the jagged patterning of the edge region proposed here requires no additional work, and the occurrence of mechanical stresses can therefore be reduced in a simple and cost-effective manner.

Figure 6:
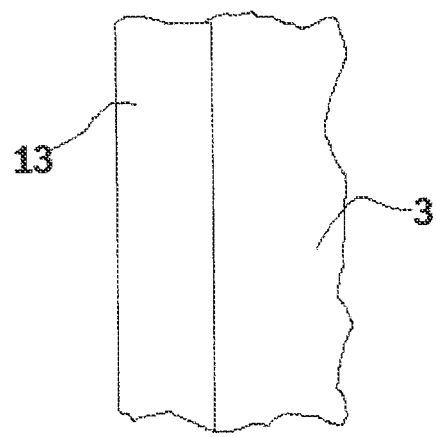
FIG. 6 shows a plan view of a semiconductor element.

FIG. 6 shows a plan view of semiconductor element 3 having a dielectric layer 13, which corresponds to the plan view of FIG. 3. In contrast to FIG. 3, however, the inwardly pointing area of dielectric layer 13 is not developed in the jagged form shown in FIG. 3.

Figure 7:
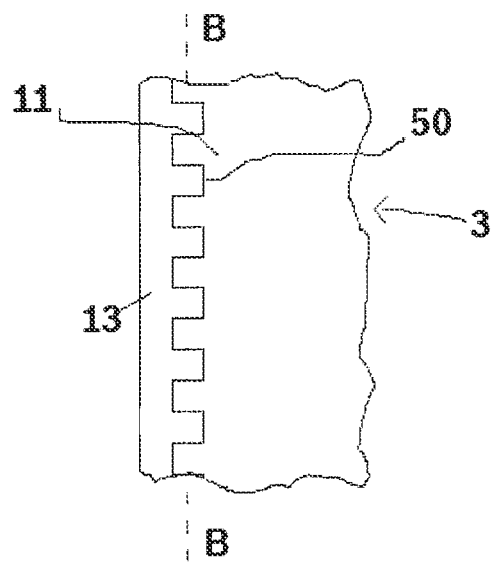
FIG. 7 shows a further plan view of a semiconductor element.

FIG. 7 shows a view that corresponds to the view of FIG. 4, i.e., it shows semiconductor element 3 according to FIG. 6 following the deposition and patterning of surface metallization 11. However, in contrast to FIG. 4, surface metallization 11 is provided with jagged patterning 11 in an edge region.

Figure 8:
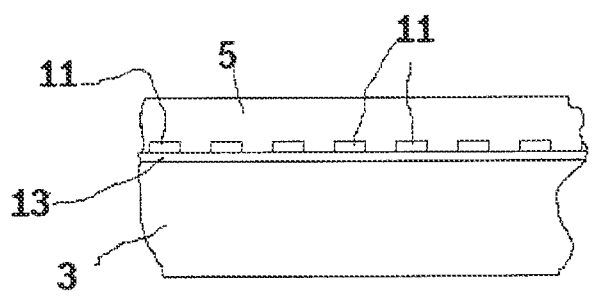
FIG. 8 shows a section through FIG. 7.

FIG. 8 depicts a section through semiconductor element 3 having dielectric layer 13 and patterned surface metal layer 11 along line B-B of FIG. 7, which shows sinter layer 5 in addition. Semiconductor element 3 and dielectric layer 13 deposited thereon, which is developed as an uninterrupted layer along line B-B, can be seen in the cross-section of FIG. 8. The individual jags of the jagged metal layer 11 are visible on the top surface of dielectric layer 13. Sinter layer 5 follows metal layer 11, which in turn fills the raised areas and depressions of metal layer 11 again. Sinter layer 5 rests tightly against the raised areas and depressions of metal layer 11, so that once again, as already described in connection with FIG. 5, an enlarged surface is created between sinter layer 5 and metal layer 11 or dielectric layer 13 lying underneath. In contrast to FIG. 5, the enlarged surface toward sinter layer 5 thus is not formed exclusively in the direction of the surface of the metal layer, but also in the direction of the surface of metal layer 11 and dielectric layer 13 lying exposed within the depressions. Once again, an enlarged surface therefore causes a distribution of the occurring mechanical forces to a larger area and thereby avoids the occurrence of voltage spikes.

FIGS. 9a, 9b, 10a, and 10b show plan views of a semiconductor element 3 provided with deposited dielectric layer 13 and metal layer 11, both of which are patterned. Sinter layer 5 is not shown in the figure. These represent additional specific embodiments of the present invention. The dielectric layer extends in the form of a strip from the left edge to underneath metal layer 11; a dashed line 130 in the figures illustrates how far the strip of dielectric layer 13 extends toward the right underneath metal layer 11.

Figure 9A:
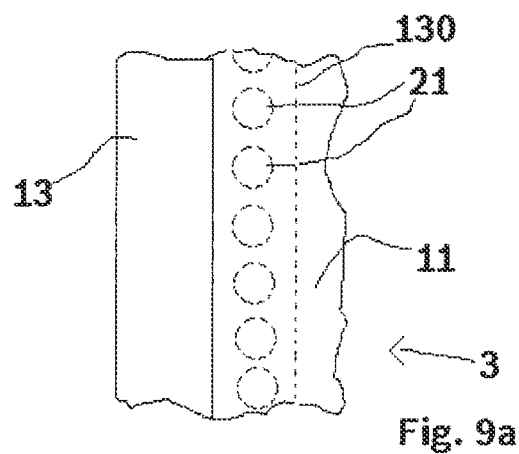
FIGS. 9a, 9b, 10a, and 10b show further plan views of semiconductor elements.
Figure 9B:
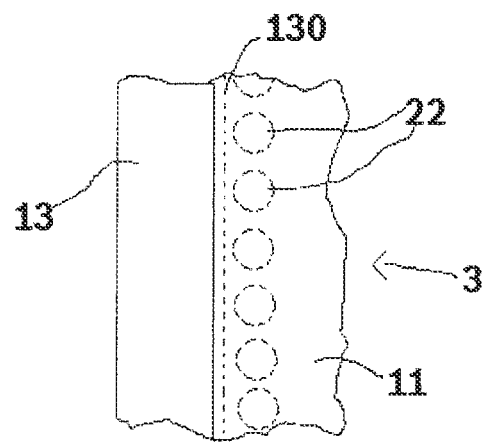

FIG. 9a shows another form of patterning of dielectric layer 13 in a plan view of a semiconductor element 3. Dielectric layer 13 has circular perforated structures 21 in the edge region. As a result, the surface of semiconductor element 3 is exposed inside these perforated structures 21, so that a metal layer 11 deposited subsequently comes to lie directly on semiconductor element 3. These perforated structures 21 must therefore have sufficient clearance from the edge of semiconductor element 3 so that no unintentional contacting of the region of semiconductor element 3 disturbed by the sawing takes place. As an alternative, it is also possible to provide dielectric insular structures 22, which are developed in the form of circular insular structures 22 in the plan view of FIG. 9b. These insular structures 22 also cause corresponding patterning of metallization 11 applied thereon, which once again increases the surface for the connection to sinter layer 5 correspondingly.

Figure 10A:
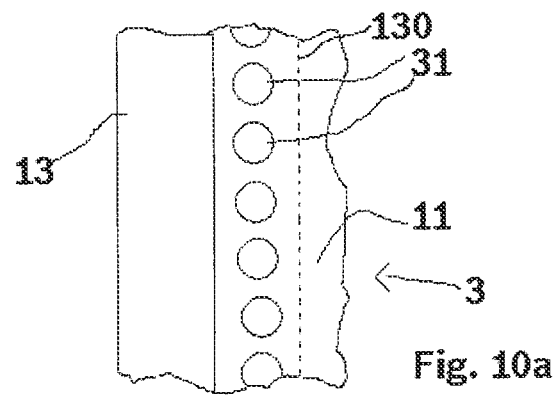
Figure 10B:
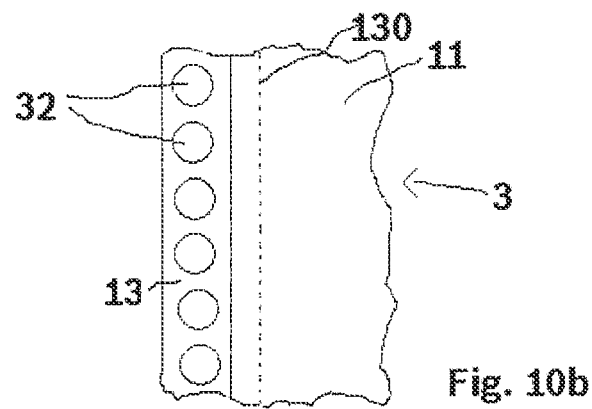

FIG. 10a shows a further alternative for enlarging the area between sinter layer 5 and semiconductor element 3, in this case by additional patterning of metal layer 11. The plan view according to FIG. 10a corresponds to the plan views of FIGS. 4 and 7, i.e., in the plan view of FIG. 10a, a dielectric layer 13 and a patterned surface metal layer 11 are situated on the top surface of semiconductor element 3.

Surface metal layer 11, for example, may be patterned by the introduction of perforated structures 31; in other words, in the area of these perforated structures 31, sinter layer 5 extends directly down to a dielectric layer 13 lying underneath or to the surface of semiconductor element 3. In addition, like in FIG. 10b, insular structures 32 may be provided, i.e., circular areas of metallization layer 11 situated on dielectric layer 13, as shown here, for example. These insular structures 32 of surface metal layer 11 also create patterning of the connection surface between sinter layer 5 and the top side of semiconductor element 3, which once again distributes the occurring mechanical forces to a larger area, so that the mechanical forces are distributed relative to the surface.

Figure 11:
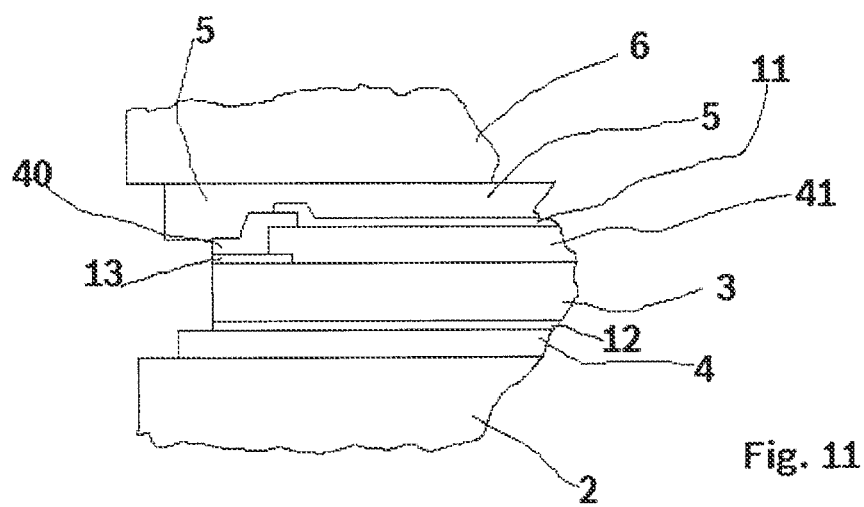
FIG. 11 shows a detailed section through an electronic component.

FIG. 11 illustrates another option for reducing the mechanical forces. A detailed sectional view, which corresponds to the sectional view according to FIG. 2, is shown in FIG. 11. Reference numerals 2, 3, 4, 5, 6, 11, 12 and 13 once again denote the same items as in FIG. 2. In addition, a thick, stress-reducing metal layer 41 and a thick, stress-reducing dielectric layer 40 are provided. Thick, stress-reducing metal layer 41 is situated between the semiconductor element and surface metallization 11 and patterned roughly in the same manner as metallization 11, such that this layer is provided in a center region for the most part and leaves the edge region free. A relatively soft material such as aluminum is used as material, which contributes to the reduction of the occurring mechanical stresses on account of its softness and its elastic modulus. Layer thicknesses between 1 and 5 µm may be selected as layer thicknesses. A further, thicker dielectric layer 40 is additionally provided in the edge region above dielectric layer 13, which may be developed at a layer thickness of approximately 0.5 to 2 µm. Different dielectric materials, such as silicon oxide, silicon nitride, or a plastic such as polyimide, for example, may be used for the dielectric layer. It is also possible to employ layer sequences of different dielectric materials. This layer, too, contributes to a reduction of mechanical stresses between metallic contacting 6 and semiconductor element 3 and in this way causes the mechanical stresses that arise by temperature changes and the like to be reduced.

The measures of FIG. 11 may be combined with the additional measures described in FIGS. 3 through 10. Moreover, the individually described measures can be used at the same time next to each other. For example, patterning of the dielectric layer according to FIGS. 6 through 8 is combinable with patterning of metal layer 11 according to FIG. 10. In the same way patterning of metal layer 11 according to FIGS. 6 through 8 can be combined with the perforated structures or insular structures of FIG. 9. In addition, the patterning of the dielectric layer according to FIGS. 3 through 5 can be employed with the patterning of metal layer 11 according to FIGS. 6 through 8 in combination with the measures of FIG. 11. Any combination of patterning measures is possible, either with or without a combination of the measures according to FIG. 11.

What is claimed is:
1. An electronic component, comprising:
 a plate-shaped semiconductor element connected to a metallic contacting by a sinter layer; and
 a dielectric layer with a surface metal layer situated on the dielectric layer, wherein the dielectric layer and a portion of the surface metal layer are provided in an edge region of the semiconductor element, the edge region being provided with raised areas and depressions by patterning of at least one of the dielectric layer and the surface metal layer, and wherein the sinter layer covers the edge region having the raised areas and depressions to connect the edge region to the metallic contacting.

2. The component as recited in claim 1, wherein the patterning is in the form of jags.

3. The component as recited in claim 2, wherein the jags are in one of rectangular, triangular, or a postage stamp edge form.

4. The component as recited in claim 1, wherein the patterning is configured as insular regions or as perforated structures.

5. The component as recited in claim 2, wherein the dielectric layer includes one of silicon oxide, silicon nitride, silicon oxynitride, or a plastic.

6. The component as recited in claim 2, wherein the surface metal layer covers an area of the surface of the semiconductor element which is provided with the dielectric layer, and establishes an electrical contact with the semiconductor element.

7. The component as recited in claim 6, wherein the sinter layer has metal particles which are sintered together.

8. The component as recited in claim 6, wherein the metallic contacting is made of one of (i) copper coated with a noble metal, or (ii) a copper alloy.

9. The component as recited in claim 2, wherein additional stress-reducing metal layers and additional stress-reducing dielectric layers are provided which are thinner than the surface metal layer and the dielectric layer.

* * * * *